(12) United States Patent
Shibata

(10) Patent No.: US 8,698,124 B2
(45) Date of Patent: Apr. 15, 2014

(54) SEMICONDUCTOR LIGHT EMITTING DEVICE

(75) Inventor: Kyohei Shibata, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 13/419,398

(22) Filed: Mar. 13, 2012

(65) Prior Publication Data

US 2013/0134385 A1    May 30, 2013

(30) Foreign Application Priority Data

Nov. 24, 2011 (JP) ................. P2011-256059

(51) Int. Cl.
*H01L 29/06* (2006.01)
*H01L 21/00* (2006.01)

(52) U.S. Cl.
USPC .............................. 257/13; 438/69

(58) Field of Classification Search
USPC ........ 257/13, 79–103, 918, 40, 642–643, 759
See application file for complete search history.

(56) References Cited

U.S. PATENT DOCUMENTS

| | | | |
|---|---|---|---|
| 2002/0142582 A1* | 10/2002 | Kim ............................. | 438/627 |
| 2005/0095699 A1* | 5/2005 | Miyauchi et al. ......... | 435/299.1 |
| 2006/0145170 A1* | 7/2006 | Cho ............................. | 257/95 |
| 2008/0063021 A1* | 3/2008 | Seo ............................. | 372/87 |
| 2008/0179606 A1* | 7/2008 | Usuda et al. .................... | 257/94 |
| 2008/0224157 A1* | 9/2008 | Slater ............................ | 257/98 |
| 2009/0128004 A1* | 5/2009 | Chao et al. ................... | 313/498 |
| 2010/0193813 A1* | 8/2010 | Kao et al. ...................... | 257/98 |
| 2010/0213550 A1 | 8/2010 | Kanno et al. | |

FOREIGN PATENT DOCUMENTS

| | | |
|---|---|---|
| JP | 11-097737 | 4/1999 |
| JP | 2008-288624 | 11/2008 |

OTHER PUBLICATIONS

U.S. Appl. No. 13/239,152, filed Sep. 21, 2011.

* cited by examiner

*Primary Examiner* — Chuong A Luu
*Assistant Examiner* — Moin Rahman
(74) *Attorney, Agent, or Firm* — Patterson & Sheridan, LLP

(57) ABSTRACT

According to one embodiment, in a semiconductor light emitting device, a semiconductor laminated body is made by laminating, in order, a first semiconductor layer of a first conductivity-type, a semiconductor light emitting layer and a second semiconductor layer of a second conductivity-type. The semiconductor laminated body includes a plurality of trenches arranged in a periodical manner to penetrate through the second semiconductor layer and the semiconductor light emitting layer and reach the first semiconductor layer. An insulating film is buried into the trenches, and has transparency to light emitted from the semiconductor light emitting layer. A first electrode is electrically connected to the first semiconductor layer. A second electrode covers an upper surface of the second semiconductor layer.

20 Claims, 13 Drawing Sheets

SEMICONDUCTOR LIGHT EMITTING DEVICE

CROSS REFERENCE TO RELATED APPLICATION

This application is based upon and claims the benefit of priority from the prior Japanese Patent Application No. 2011-256059, filed on Nov. 24, 2011, the entire contents of which are incorporated herein by reference.

FIELD

Embodiments described herein relate generally to a semiconductor light emitting device.

BACKGROUND

Conventionally, there is a semiconductor light emitting device configured such that an upper electrode of substantially the same size as that of a semiconductor light emitting layer is provided on the semiconductor light emitting layer, and light generated in the semiconductor light emitting layer immediately under the upper electrode is extracted not only from the upper surface of the semiconductor light emitting layer but from the side surfaces of the semiconductor light emitting layer.

When the size of the semiconductor light emitting layer increases in the semiconductor light emitting device, a propagation distance increases when the light generated in a central portion of the semiconductor light emitting layer immediately under the upper electrode reaches the side surfaces of the semiconductor light emitting layer. As a result, self-absorption of the semiconductor light emitting layer cannot be ignored, and the amount of light extracted from the side surfaces of the semiconductor light emitting layer decreases.

For this reason, the size of the semiconductor light emitting layer is limited, and there is a problem in that a high optical output cannot be obtained. When multiple semiconductor light emitting layers are arranged in a matrix form, a high optical output can be obtained as a whole.

However, in order to avoid reduction of the optical output caused by interference between adjacent semiconductor light emitting layers, it is necessary to ensure a certain distance between the adjacent semiconductor light emitting layers. As a result, there is a problem in that the chip size increases.

DETAILED DESCRIPTION

Figure 1A:
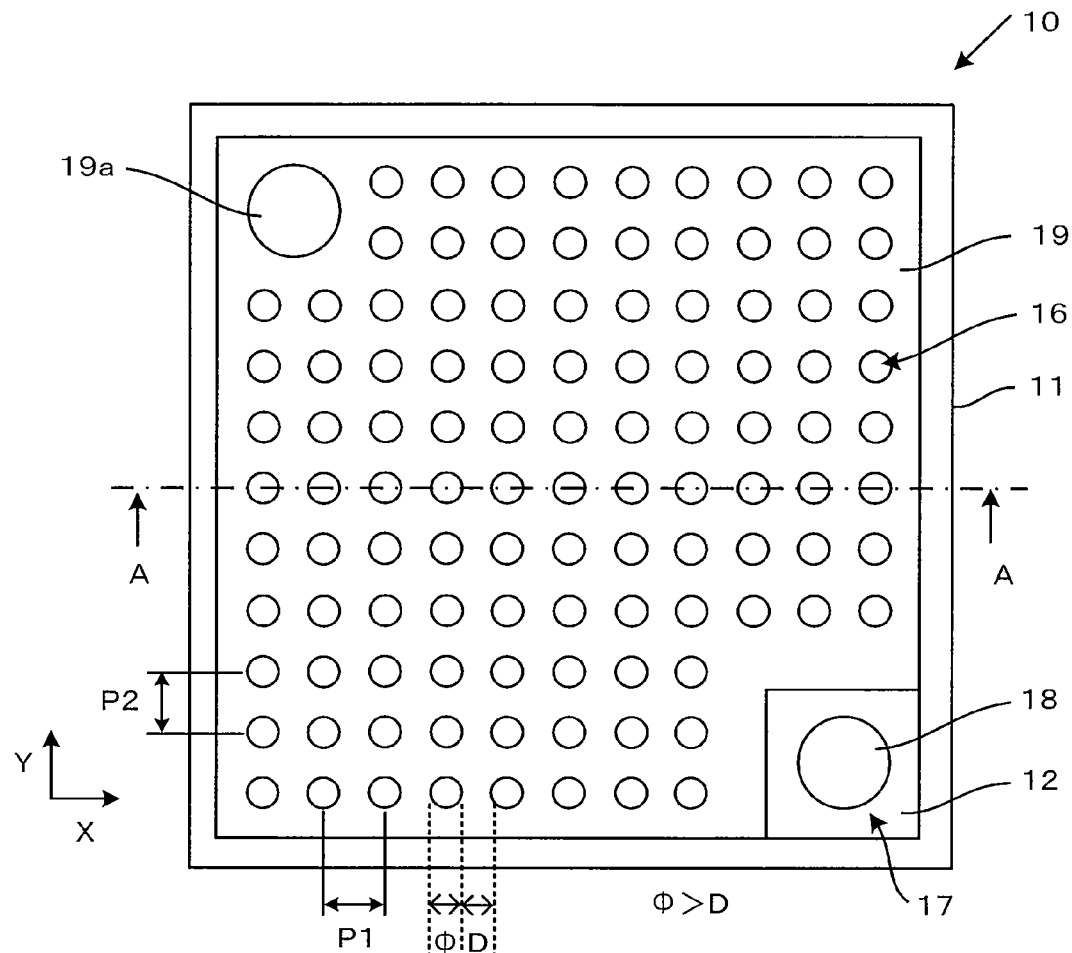
FIGS. 1A and 1B are views illustrating a semiconductor light emitting device according to a first embodiment.

According to one embodiment, in a semiconductor light emitting device, a semiconductor laminated body is made by laminating, in order, a first semiconductor layer of a first conductivity-type, a semiconductor light emitting layer and a second semiconductor layer of a second conductivity-type. The semiconductor laminated body includes a plurality of trenches arranged in a periodical manner to penetrate through the second semiconductor layer and the semiconductor light emitting layer and reach the first semiconductor layer. An insulating film is buried into the trenches, and has transparency to light emitted from the semiconductor light emitting layer. A first electrode is electrically connected to the first semiconductor layer. A second electrode covers an upper surface of the second semiconductor layer.

Hereinafter, embodiments will be described with reference to the drawings. In the drawings, same reference characters denote the same or similar portions.

First Embodiment

Figure 1B:
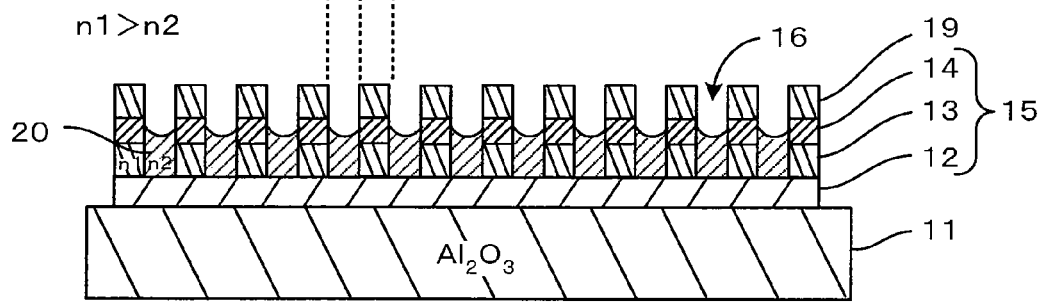
Figure 2A:
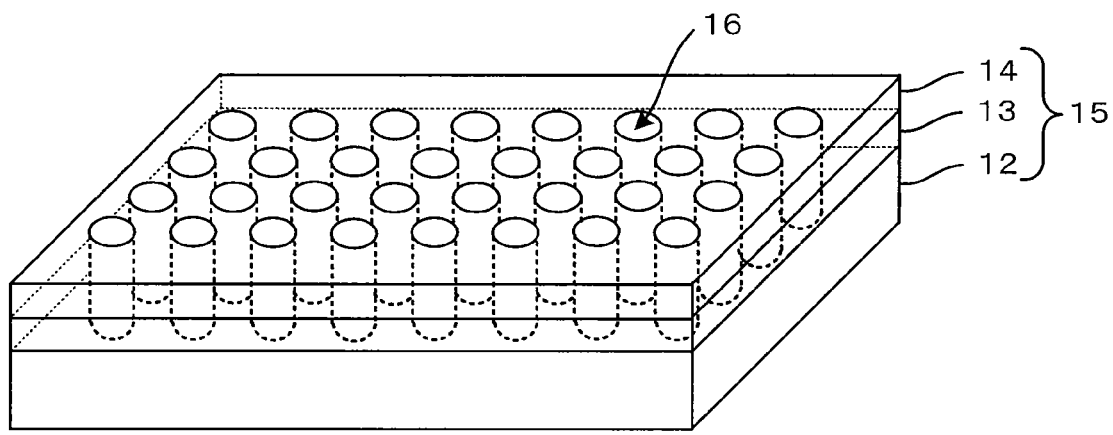
FIGS. 2A and 2B are perspective views illustrating the semiconductor light emitting device according to the first embodiment.
Figure 2B:
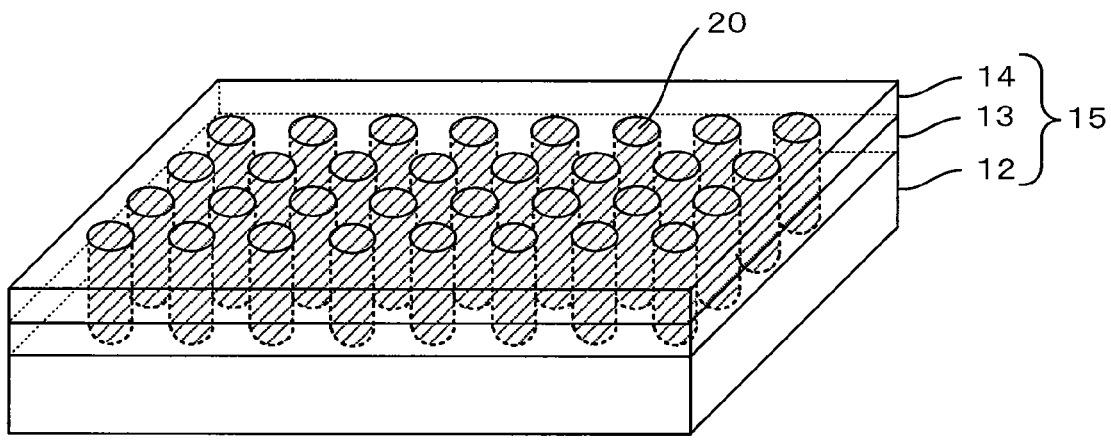
Figure 3:
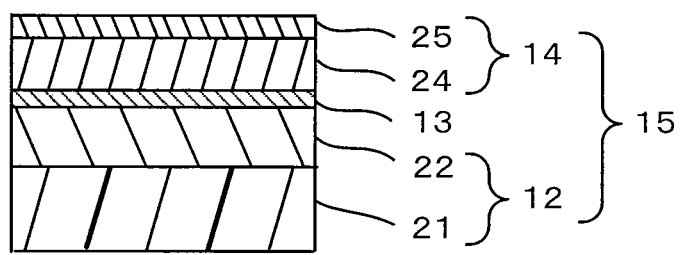
FIG. 3 is a cross-sectional view illustrating the main portion of the semiconductor light emitting device according to the first embodiment.

A semiconductor light emitting device of the first embodiment will be explained with reference to FIGS. 1A to 3. FIGS. 1A and 1B are figures illustrating the semiconductor light emitting device of the first the embodiment. FIG. 1A is a plan view of the semiconductor light emitting device of the first embodiment. FIG. 1B is a cross sectional view taken along line A-A of FIG. 1A and viewed in an arrow direction. FIGS. 2A and 2B are perspective views illustrating a main portion. FIG. 3 is a cross sectional view illustrating the main portion in an enlarged manner.

The semiconductor light emitting device of the first embodiment is a blue LED (Light emitting Diode) using a nitride semiconductor.

As shown in FIGS. 1A and 1B, a semiconductor light emitting device 10 of the first embodiment is arranged with a semiconductor laminated body 15 including an N-type (first conductivity type) first semiconductor layer 12, a semiconductor light emitting layer 13, and a P-type (second conductivity type) second semiconductor layer 14 are laminated in order on a substrate 11.

The semiconductor laminated body 15 has multiple column-shaped trenches 16 which penetrate through the second semiconductor layer 14 and the semiconductor light emitting layer 13 and come into abutment with the first semiconductor layer 12. The trench 16 is in a cylindrical column shape, for example.

The multiple trenches 16 are arranged in a periodical manner, i.e., a lattice form. More specifically, the multiple trenches 16 are arranged with a pitch P1 in an X direction parallel to a side of the substrate 11 and are arranged with a pitch P2 in a Y direction perpendicular to the X direction. The pitch P1 and the pitch P2 are set substantially equally.

The internal diameter φ (size) of the trench 16 is longer than a distance D between adjacent trenches 16 (φ>D). The pitch P1, the internal diameter φ, and the distance D satisfy the following relationship P1=φ+D.

The distance D needs to be longer than ½ of the wavelength of light emitted from the semiconductor light emitting layer 13.

The semiconductor laminated body 15 has a notch portion 17 at a corner portion, in which portions of the second semiconductor layer 14 and the semiconductor light emitting layer 13 are removed, so that the first semiconductor layer 12 is exposed.

A first electrode 18 (N-type electrode) is provided on the first semiconductor layer 12 exposed in the notch portion 17. The first electrode 18 includes a bonding pad. The first electrode 18 is a laminated film including titanium (Ti)/platinum (Pt)/gold (Au) capable of coming into ohmic contact with N-type GaN, for example.

A second electrode 19 (P-side electrode) is provided to cover substantially the entire surface of the second semiconductor layer 14. A bonding pad 19a is provided at a corner portion facing the first electrode 18 of the second semiconductor layer 14. The second electrode 19 is gold (Au) capable of coming into ohmic contact with P-type GaN, for example.

An insulating film 20 is provided to fill the trenches 16. The insulating film 20 has transparency to light emitted from the semiconductor light emitting layer 13. The insulating film 20 is in contact with the second semiconductor layer 14 and the semiconductor light emitting layer 13 exposed on the side surfaces of the trenches 16, and the upper surface of the insulating film 20 is in a concave shape.

The insulating film 20 is an SOG (Spin On Glass) film of $SiO_2$ system that can be applied by spin coater, for example.

FIGS. 2A and 2B are perspective views illustrating the semiconductor laminated body 15 of the semiconductor light emitting device 10. FIG. 2A shows how the multiple trenches 16 penetrating through the second semiconductor layer 14 and the semiconductor light emitting layer 13 and reaching first semiconductor layer 12 are arranged in the semiconductor laminated body 15 in a periodical manner. FIG. 2B shows how the insulating film 20 is buried into the multiple trenches 16.

FIG. 3 is a cross-sectional view illustrating the detailed structure of the semiconductor laminated body 15 of the semiconductor light emitting device 10. As shown in FIG. 3, the first semiconductor layer 12 includes a GaN layer 21 with a thickness of approximately 3 μm, for example, and an N-type GaN clad layer 22 having a thickness of approximately 2 μm, for example, provided on the GaN layer 21. The GaN layer 21 is a base single crystal layer to grow the semiconductor light emitting layer 13 on the substrate 11. The substrate is a sapphire substrate, for example.

The semiconductor light emitting layer 13 is formed in such a multiple quantum well structure that a GaN barrier layer with a thickness of approximately 5 nm and an InGaN well layer with a thickness of approximately 2.5 nm are stacked alternately.

A composition ratio x of In in each InGaN well layer (the $In_xGa_{(1-x)}N$ layer, 0<x<1) is set at approximately 0.1 for the purpose of making a peak light-emission wavelength equal to approximately 450 nm, for example.

The second semiconductor layer 14 includes a P-type GaN clad layer 24 with a thickness of approximately 100 nm, for example, and a P-type GaN contact layer 25 with a thickness of approximately 10 nm, for example, provided on the P-type GaN clad layer 24.

A refraction index n2 of the insulating film 20 is lower than an effective refraction index n1 of the semiconductor laminated body 15. As described above, most of the semiconductor laminated body 15 is GaN, and therefore, the effective refraction index n1 of the semiconductor laminated body 15 can be represented by the refraction index of GaN.

The refraction index n1 of GaN against light having a wavelength of 450 nm is about 2.47. The refraction index n2 of the insulating film 20 (silicon oxide film) is about 1.46 (n1>n2).

The semiconductor light emitting device 10 explained above is configured such that the second electrode 19 of substantially the same size as that of the semiconductor light emitting layer 13 is provided so that the light emitted by the semiconductor light emitting layer 13 immediately under the second electrode 19 is extracted from the side surfaces of the trenches 16 without any self-absorption, and the insulating film 20 buried into the trenches 16 allows the extracted light to propagate in a direction in which the difference of refraction indexes is smaller.

The direction in which the difference of refraction indexes is smaller means a direction from the semiconductor light emitting layer 13 to the insulating film 20 and a direction from the insulating film 20 toward the atmosphere.

Further, the semiconductor light emitting device 10 is configured such that the trenches 16 are arranged in a periodical manner so that a high optical output can be obtained as a whole. At this occasion, in order to avoid reduction of the optical output caused by interference, e.g., the light is shielded by adjacent semiconductor light emitting layers 13, the effective distance is ensured between the adjacent semiconductor light emitting layers 13.

The effective distance means a ratio (φ/n2) between the internal diameter φ of the trench 16 and the refraction index n2 of the insulating film 20.

Figure 4:
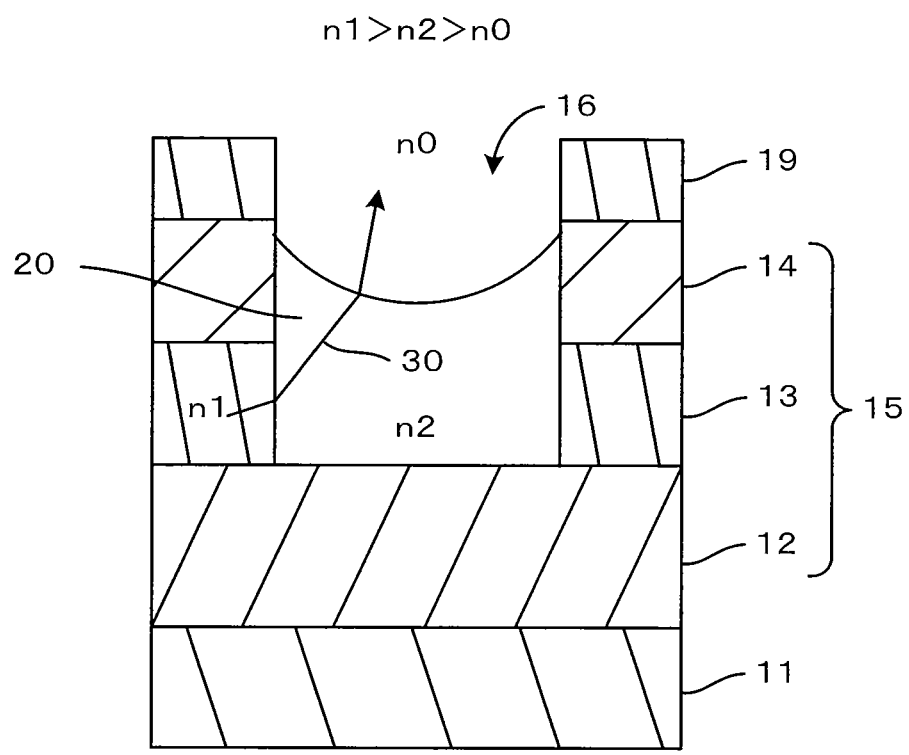
FIG. 4 is a figure illustrating a propagation pass of light extracted from a side surface of the semiconductor light emitting device according to the first embodiment.

FIG. 4 is a figure illustrating how the light extracted from a side surface of the trench 16 propagates. As shown in FIG. 4, the total reflection angle at the interface between the semiconductor light emitting layer 13 and the insulating film 20 is large (approximately 54°), and therefore, among light that is not totally-reflected and is extracted to the insulating film 20, light 30 coming toward the second electrode 19 increases, and it is likely to increase the chance that the light is not totally-reflected at the interface between the insulating film 20 and the atmosphere but is extracted into the atmosphere.

On the other hand, when the insulating film 20 is not provided, the total reflection angle at the interface between the semiconductor light emitting layer 13 and the insulating film 20 is small (approximately 24°), and therefore, among the light that is not totally-reflected and is extracted to the insulating film 20, much light comes toward the semiconductor light emitting layer 13 makes the major part, and it is likely to increase the chance that the light is shielded by the semiconductor light emitting layer 13.

Next, a method of manufacturing the semiconductor light emitting device 10 will be explained. FIGS. 5A to 7B are cross-sectional views illustrating the steps of manufacturing the semiconductor light emitting device 10 in sequential order.

Figure 5A:
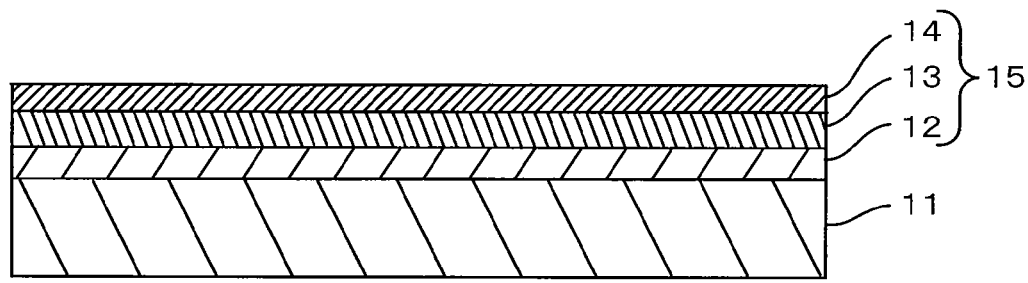
FIGS. 5A to 7B are cross-sectional views illustrating the steps of manufacturing the semiconductor light emitting device in sequential order according to the first embodiment.

As shown in FIG. 5A, The first semiconductor layer 12, the light emitting layer 13 and the second semiconductor layer 14 are epitaxially grown on the substrate 11 by a MOCVD (metal organic chemical vapor deposition) method so that the semiconductor laminated body 15 is formed on the substrate 11. The method of forming the semiconductor laminated body 15 is briefly described below.

As a preliminary treatment, the substrate 11 (sapphire substrate with a C plane of a plane direction) is subjected to organic cleaning and acid cleaning, for example. The resultant substrate 11 is contained in a reaction chamber of the MOCVD system. Thereafter, the temperature of the substrate 11 is raised to 1100° C., for example, by high-frequency heating in a normal-pressure atmosphere of a mixed gas of a nitrogen ($N_2$) gas and a hydrogen ($H_2$) gas. Thereby, the surface of the substrate 11 is etched in gas phase, and a natural oxide film formed on the surface of the sapphire substrate is removed.

The GaN layer 21 with a thickness of 3 μm is formed by using the mixed gas of the $N_2$ gas and the $H_2$ gas as a carrier gas while supplying an ammonium ($NH_3$) gas and a trimethyl gallium (TMG) gas, for example, as process gases.

After the N-type GaN clad layer 22 with a thickness of 2 μm is formed in the similar manner supplying a silane ($SiH_4$) gas, for example, as the N-type dopant.

The temperature of the substrate 11 is decreased to and kept at 800° C. which is lower than 1100° C., for example, while continuing supplying the $NH_3$ gas with the supply of the TMG gas and the $SiH_4$ gas stopped.

The GaN barrier layer with a thickness of 5 nm is formed by using the $N_2$ gas as the carrier gas while supplying the $NH_3$ gas, the TMG gas, for example, as the process gases. After that, the InGaN well layer with a thickness of 2.5 nm, in which the In composition ratio is 0.1, is formed by further supplying a trimethyl indium (TMI) gas, for example, as the process gas.

The forming of the GaN barrier layer and the forming of the InGaN well layer are alternately repeated 7 times, for example, while continuing or stopping the supply of the TMI gas. Thereby, the semiconductor light emitting layer 13 is obtained.

An undoped GaN cap layer with a thickness of 5 nm (not shown) is formed while continuing supplying the TMG gas and the $NH_3$ gas with the supply of the TMI gas stopped.

The temperature of the substrate 11 is raised to and kept at 1030° C., for example, which is higher than 800° C., in the $N_2$ gas atmosphere while continuing supplying the $NH_3$ gas with the supply of the TMG gas stopped.

The P-type GaN clad layer 24 with a thickness of 100 nm, in which the concentration of Mg is approximately 1E20 $cm^{-3}$, is formed by using the mixed gas of the $N_2$ gas and the $H_2$ gas as the carrier gas while supplying: the $NH_3$ gas, the TMG gas as the process gases; and a bis(cyclopentadienyl) magnesium (Cp2Mg) gas as the P-type dopant.

The P-type GaN contact layer 25 with a thickness of approximately 10 nm, in which the concentration of Mg is approximately 1E21 $cm^{-3}$, is formed while supplying an increased amount of the Cp2Mg gas.

The temperature of the substrate 11 is lowered naturally with the supply of only the carrier gas continued while continuing supplying the $NH_3$ gas with the supply of the TMG gas stopped. The supplying of the $NH_3$ gas is continued until the temperature of the substrate 11 reaches 500° C. Thereby, the nitride semiconductor laminated body 15 is formed on the substrate 11.

Figure 5B:
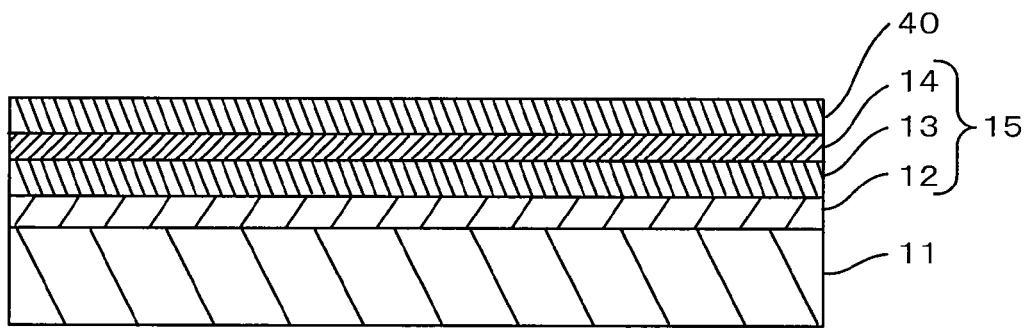

As shown in FIG. 5B, an Au film 40 having a thickness of about 200 nm is formed on the semiconductor laminated body 15 by sputtering method, for example.

Figure 5C:
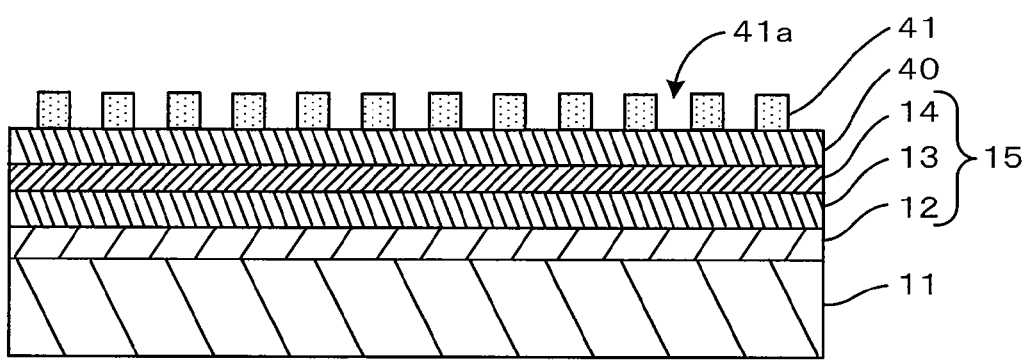

As shown in FIG. 5C, a resist film 41 is formed on the Au film 40 by photolithography method. The resist film 41 includes openings 41a corresponding to the trenches 16 and an opening corresponding to the notch portion 17 (not shown).

Figure 6A:
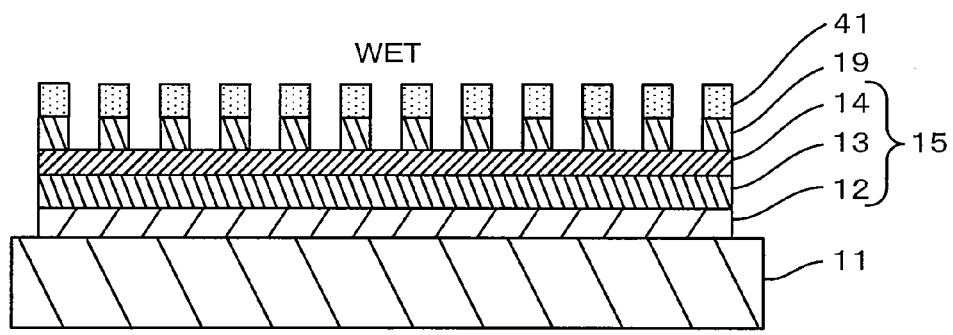

As shown in FIG. 6A, using the resist film 41 as a mask, the Au film 40 is subjected to wet etching using a chemical solution of iodine system, so that the second electrode 19 as shown in FIGS. 1A and 1B is formed.

Figure 6B:
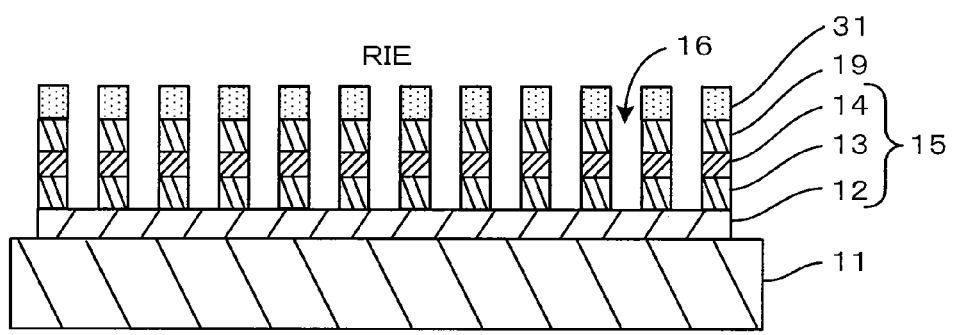

As shown in FIG. 6B, the second semiconductor film 14 and the semiconductor light emitting layer 13 are anisotropically etched by RIE (Reactive Ion Etching) method using a gas of chlorine system, for example, using the resist film 41 and the second electrode 19 as a mask, until the first semiconductor layer 12 is exposed. As a result, the trenches 16 and the notch portion 17, not shown, are formed.

Figure 6C:
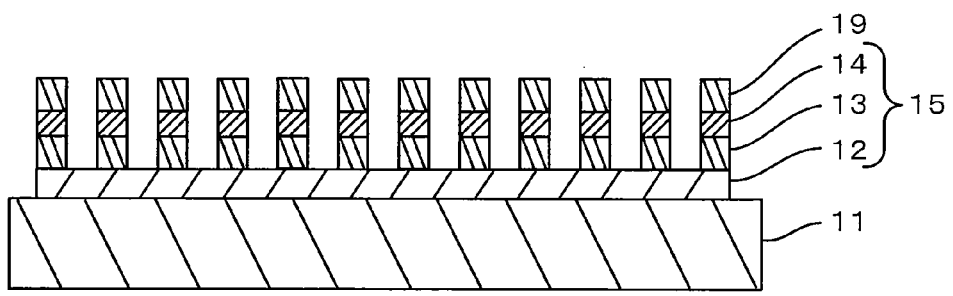

As shown in FIG. 6C, the resist film 41 is removed using an asher, for example, and thereafter, the first electrode 18 is formed in the notch portion 17, not shown, and the bonding pad 19a, not shown, is formed.

Figure 7A:
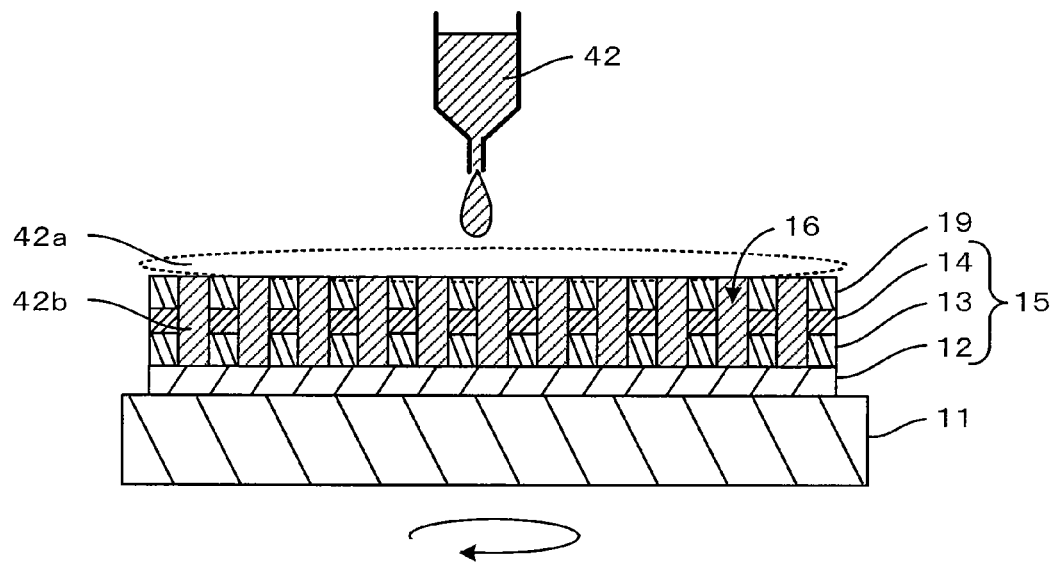

The insulating film 20 is formed by spin coat method, for example, as follows. As shown in FIG. 7A, a coating liquid 42 for forming inorganic $SiO_2$ coating is dropped onto the substrate 11 by a dispenser, for example. The coating liquid 42b in the trenches is kept but the other coating liquid 42a is removed by adjusting the number of rotations of the substrate 11.

Figure 7B:
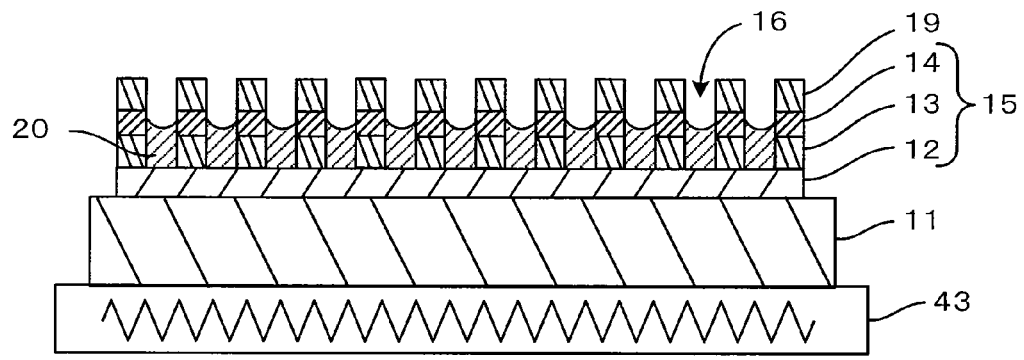

As shown in FIG. 7B, the substrate 11 is heated by a hotplate 43, for example, and the coating liquid 42a is cured. The solvent in the coating liquid 42b is evaporated by heating, and the coating liquid 42b is condensed and solidified. As a result, the insulating film 20 is obtained, wherein the insulating film 20 is in contact with the side surface of the second semiconductor layer 14 and the semiconductor light emitting layer 13 exposed on the inner surface of the trench 16, and the upper surface of the insulating film 20 is in a concave shape.

As explained above, in the semiconductor light emitting device 10 of the first embodiment, the trenches 16 are arranged on the semiconductor laminated body 15 in the periodical manner, the second electrode 19 of substantially the same size as that of the semiconductor light emitting layer 13 is provided, and the insulating film 20 buried within the trenches 16 is provided.

As a result, the light generated by the semiconductor light emitting layer 13 immediately under the second electrode 19 can be extracted from the side surfaces of the trenches 16 without any self-absorption, and the light extracted from the side surfaces of the trenches 16 can propagate in the direction in which the difference of refraction indexes is smaller. Therefore, the semiconductor light emitting device with a high optical output can be obtained.

Here, the description has been given for the case where the light is extracted from the side surface of the trench 16. However, the light can also be extracted from the upper surface of the second semiconductor film 14.

Figure 8A:
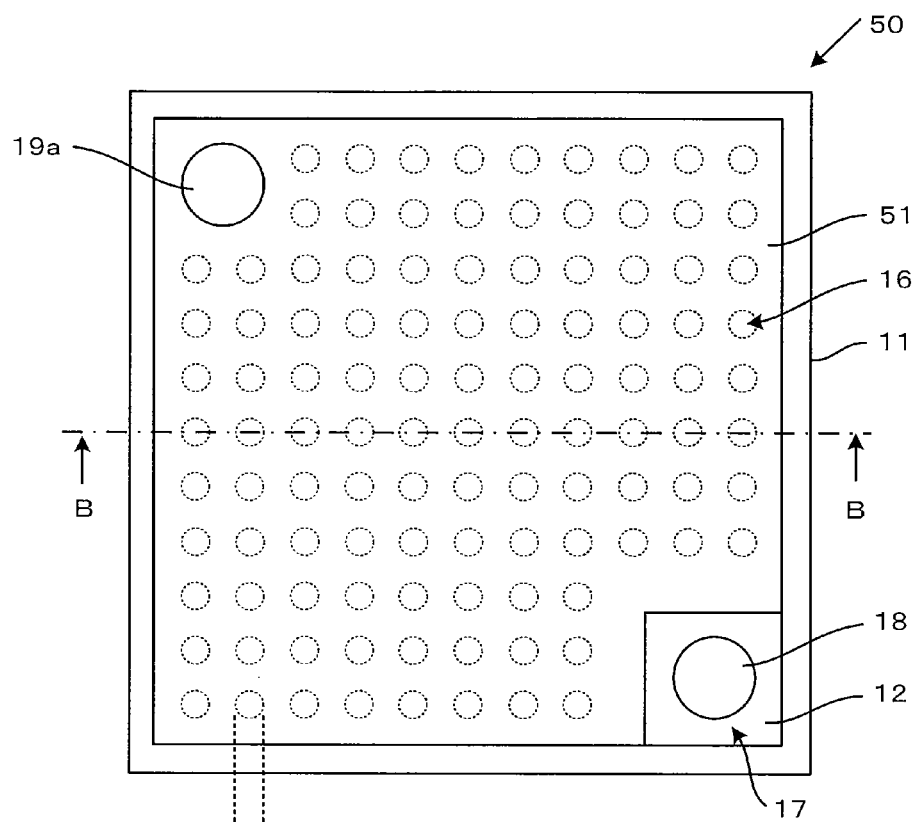
FIGS. 8A and 8B are views illustrating another semiconductor light emitting device according to the first embodiment.
Figure 8B:
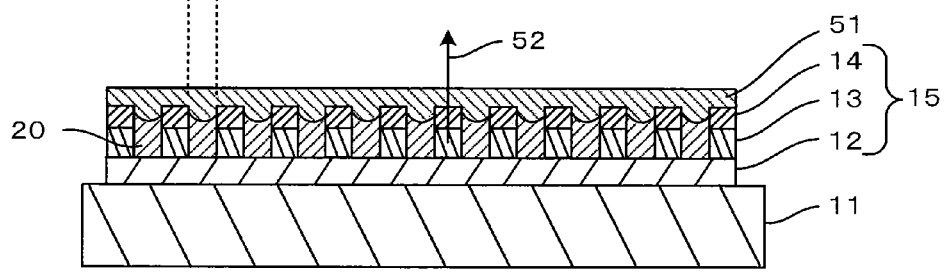

FIGS. 8A and 8B are figures illustrating a semiconductor light emitting device in which light can also be obtained from the upper surface of the second semiconductor layer 14. FIG. 8A is a plan view of the semiconductor light emitting device. FIG. 8B is a cross sectional view taken along line B-B of FIG. 8A and viewed in an arrow direction.

As shown in FIGS. 8A and 8B, in a semiconductor light emitting device 50, a transparent conductive film 51 is provided on the upper surface of the second semiconductor film 14 and the upper surface of the insulating film 20. The transparent conductive film 51 has transparency to light emitted from the semiconductor light emitting layer 13.

The transparent conductive film 51 is an ITO (Indium Tin Oxide) film having a thickness of about 100 nm to 200 nm, for example. The transparent conductive film 51 is provided to be in contact with the second semiconductor film 14 exposed on the side surfaces of the trenches 16 but not to be in contact with the semiconductor light emitting layer 13. It is possible to prevent the semiconductor light emitting layer 13 from being short-circuited by the transparent conductive film 51.

The ITO film is formed by sputtering method, for example. The ITO film is subjected to thermal treatment in order to ensure ohmic contact between the ITO film and the P-type GaN contact layer 25. For example, it is appropriate to perform the thermal treatment in nitrogen atmosphere or mixed atmosphere including nitrogen and oxygen at a temperature of about 400 to 750° C. for about one to 20 minutes.

The light 52 coming from the semiconductor light emitting layer 13 to the second semiconductor layer 14 passes through the transparent conductive film 51, and is extracted to the outside. Therefore, there is an advantage in that the optical output increases. Since a refraction index n3 of the transparent conductive film 51 (ITO film) is about 2.0, the total reflection at the interface between the second semiconductor layer 14 and the transparent conductive film 51 is suppressed as compared with the total reflection at the interface between the second semiconductor layer 14 and the atmosphere.

The reason why the transparent conductive film 51 is also provided on the insulating film 20 is due to the manufacturing steps. It is not necessary to provide the transparent conductive film 51 on the insulating film 20.

The description has been given for the case where the semiconductor laminated body 15 is provided on the insulating substrate 11. However, the semiconductor laminated body 15 may also be provided on a conductive substrate.

Figure 9A:
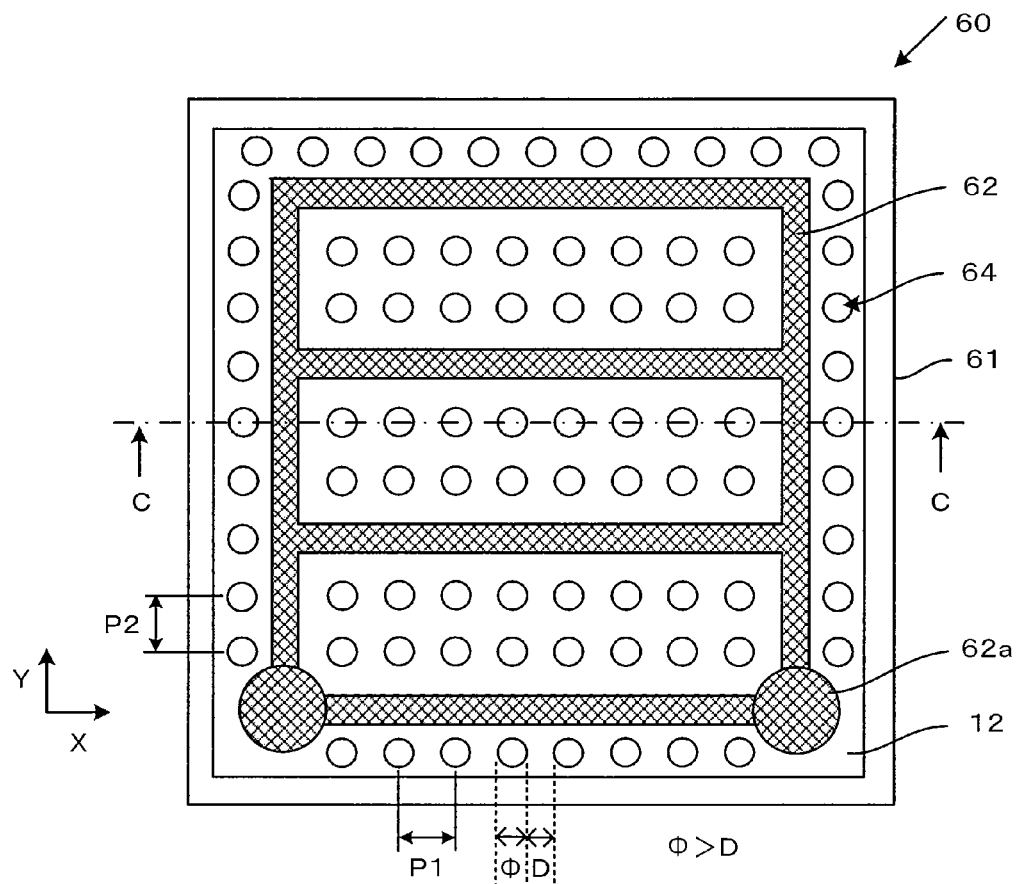
FIGS. 9A and 9B are views illustrating another semiconductor light emitting device according to the first embodiment.
Figure 9B:
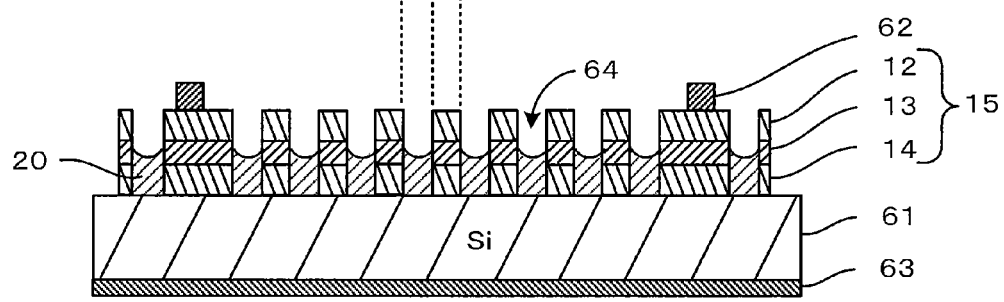

FIGS. 9A and 9B are figures illustrating a semiconductor light emitting device in which the semiconductor laminated body 15 is provided on the conductive substrate. FIG. 9A is a plan view of the semiconductor light emitting device in which the semiconductor laminated body 15 is provided on the conductive substrate. FIG. 9B is a cross sectional view taken along line C-C of FIG. 9A and viewed in an arrow direction.

As shown in FIGS. 9A and 9B, in a semiconductor light emitting device 60, the semiconductor laminated body 15 is provided on the conductive substrate 61 with a bonding layer (not shown) interposed therebetween. The conductive substrate 61 and the second semiconductor layer 14 of the semiconductor laminated body 15 face each other.

The first electrode 62 in a grating form is provided on the first semiconductor layer 12 of the semiconductor laminated body 15. Bonding pads 62a are provided at corner portions of the first semiconductor layer 12. A second electrode 63 is provided at the side opposite to the first electrode 62 of the conductive substrate 61.

The semiconductor laminated body 15 has multiple column-shaped trenches 64 that penetrate though the semiconductor laminated body 15 and reach the conductive substrate 61. The multiple trenches 64 are arranged in a lattice form except the region of the first electrode 62 and the bonding pads 62a.

An insulating film 20 is provided to fill the trenches 64. The insulating film 20 has transparency to light emitted from the semiconductor light emitting layer 13.

The conductive substrate 61 is a silicon substrate, for example. The silicon has better heat radiation property than sapphire, and therefore, the semiconductor light emitting device 60 is suitable for a semiconductor light emitting device driven with a high current.

Figure 10A:
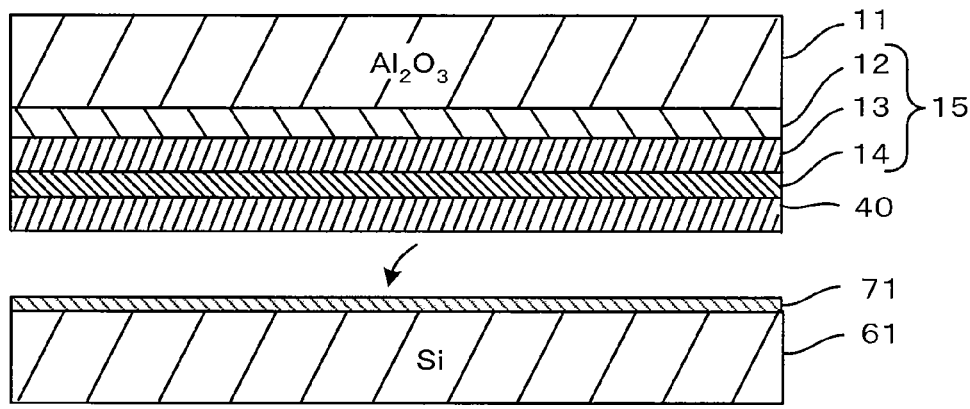
FIGS. 10A to 10C are cross-sectional views illustrating the main portions of the steps of manufacturing the other semiconductor light emitting device in sequential order according to the first embodiment.
Figure 10B:
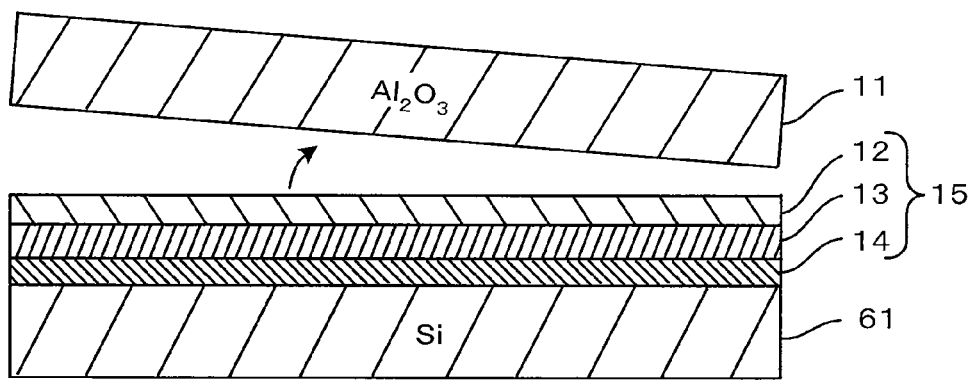
Figure 10C:
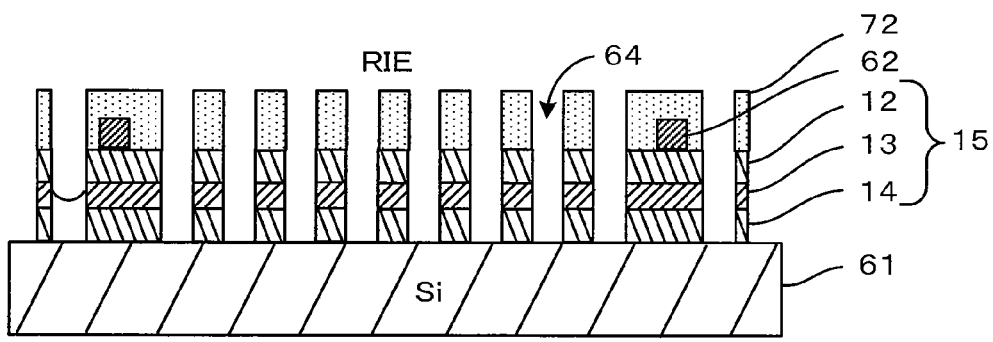

Subsequently, a method for manufacturing the semiconductor light emitting device 60 will be explained. FIGS. 10A to 10C are cross sectional views illustrating main portions of steps of manufacturing the semiconductor light emitting device 60.

As shown in FIG. 10A, like FIGS. 5A and 5B, the semiconductor laminated body 15 is formed on the substrate 11, and the gold film 40 is formed on the semiconductor laminated body 15. A gold tin alloy film 71 is formed on the conductive substrate 61.

The substrate 11 is reversed upside down, so that the gold film 40 faces the gold tin alloy film 71, and the substrate 11 and the conductive substrate 61 are placed on each other. Thereafter, the substrate 11 and the conductive substrate 61 are bonded by applying heat and pressure. The gold film 40 and the gold tin alloy film 71 are fused to form a bonding layer (not shown).

As shown in FIG. 10B, the substrate 11 and the semiconductor laminated body 15 are separated by laser lift-off method. The laser lift-off method is a method for emitting high-output laser beam to partially decompose inside of a substance by heat application and separating the substance with the decomposed portion being the border.

More specifically, laser beam is emitted, so that the laser beam passes through the substrate 11 but is absorbed by the N-type GaN clad layer 12, whereby the N-type GaN clad layer 12 is dissociated, and the substrate 11 and the N-type GaN clad layer 12 are separated.

For example, the fourth harmonic wave (266 nm) of the Nd-YAG laser is emitted from the side of the substrate 11. Sapphire is transparent to the light, and therefore, the emitted light passes through the substrate 11 and is effectively absorbed by the N-type GaN clad layer 12.

The N-type GaN clad layer 12 in proximity to the interface with the substrate 11 includes many crystalline defects, and therefore, substantially all of the absorbed light is converted into heat, and the following reaction occurs.

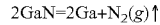

Accordingly, GaN is dissociated into Ga and $N_2$ gas.

The laser beam may be a continuous wave (CW) or a pulse wave (PW), but the laser beam is preferably a pulse light having a high peak output. A Q switch laser, a mode locked laser, and the like capable of outputting ultra short pulse light in the order of picoseconds to femtoseconds are appropriate as pulse lasers having a high peak output.

As shown in FIG. 10C, the first electrode 62 in a grating form is formed on the first semiconductor layer 12 of the semiconductor laminated body 15, and the resist film 72 having openings corresponding to the trenches 64 is formed. Using the resist film 72 as a mask, the semiconductor laminated body 15 is anisotropically etched by RIE method, so that the trenches 64 are formed.

After the resist film 72 is removed, the second electrode 63 is formed on the conductive substrate 61. As a result, the semiconductor light emitting device 60 as shown in FIGS. 9A and 9B can be obtained.

The description has been given for the case where the light generated by the semiconductor light emitting layer 13 immediately under the second electrode 19 is extracted from the side surfaces of the trenches 16. However, the light generated by the semiconductor light emitting layer 13 immediately under the second electrode 19 may also be extracted from the side surfaces of the pillars.

Figure 11A:
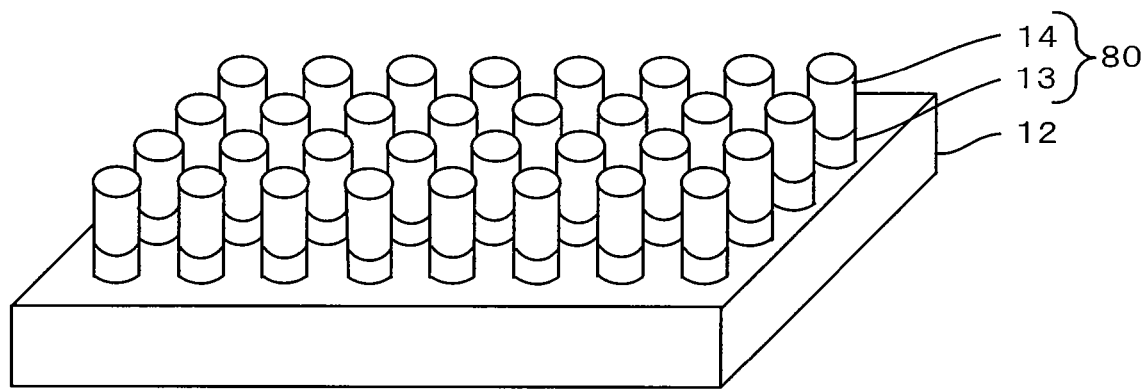
FIGS. 11A and 11B are perspective views illustrating the other semiconductor light emitting device according to the first embodiment.
Figure 11B:
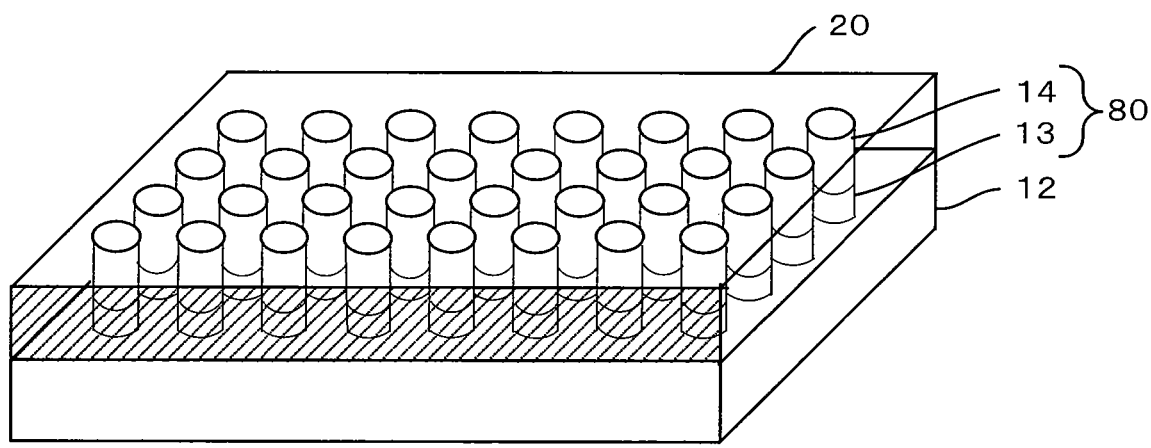

FIGS. 11A and 11B are perspective views illustrating main portions of a semiconductor light emitting device in which light generated by a semiconductor light emitting layer immediately under a second electrode is extracted from side surfaces of pillars.

FIG. 11A shows how multiple pillars 80 vertically arranged on the first semiconductor layer 12 are provided in a periodical manner. The pillar 80 is made by laminating the semiconductor light emitting layer 13 and the second semiconductor layer 14.

FIG. 11B shows how the insulating film 20 is provided to enclose the multiple pillars 80 on the first semiconductor layer 12. As the second electrode, a transparent conductive film may be provided on the insulating film 20 and the upper surfaces of the pillars 80.

Figure 12A:
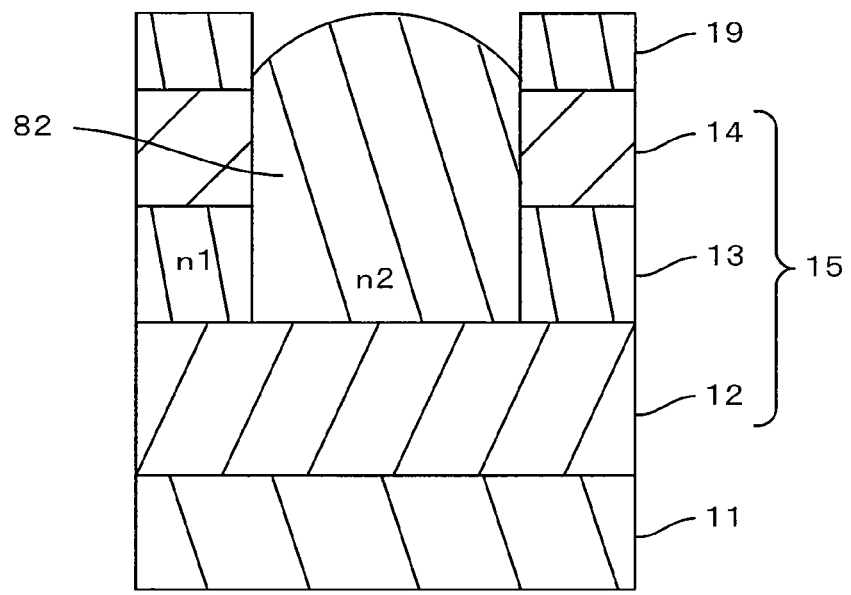
FIGS. 12A and 12B are cross-sectional views illustrating the main portions of the semiconductor light emitting device according to the first embodiment.
Figure 12B:
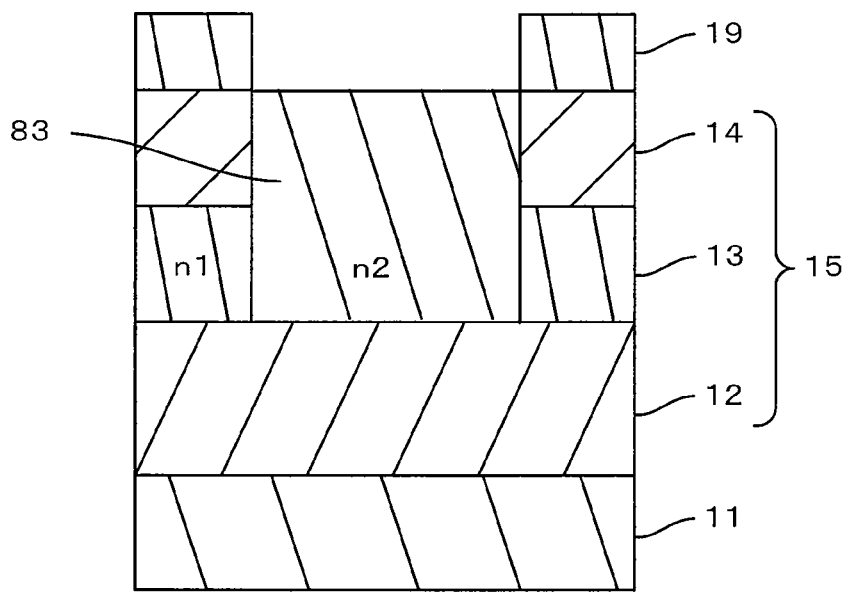

The description has been given for the case where the upper surface of the insulating film 20 is in the concave shape. However, the shape of the upper surface of the insulating film 20 is not particularly limited. FIGS. 12A and 12B are figures illustrating another shape of the upper surface of the insulating film 20. FIG. 12A shows an insulating film 82 of which an upper surface is in a convex shape. FIG. 12B shows an insulating film 83 of which an upper surface is in a flat shape. The upper surface of the insulating film may be in different shape in accordance with the purpose and feature of the semiconductor light emitting device.

The description has been given for the case where the insulating film 20 is formed by spin coat method. However, the insulating film 20 may also be formed by sputtering method and CVD (Chemical Vapor Deposition) method.

Second Embodiment

Figure 13:
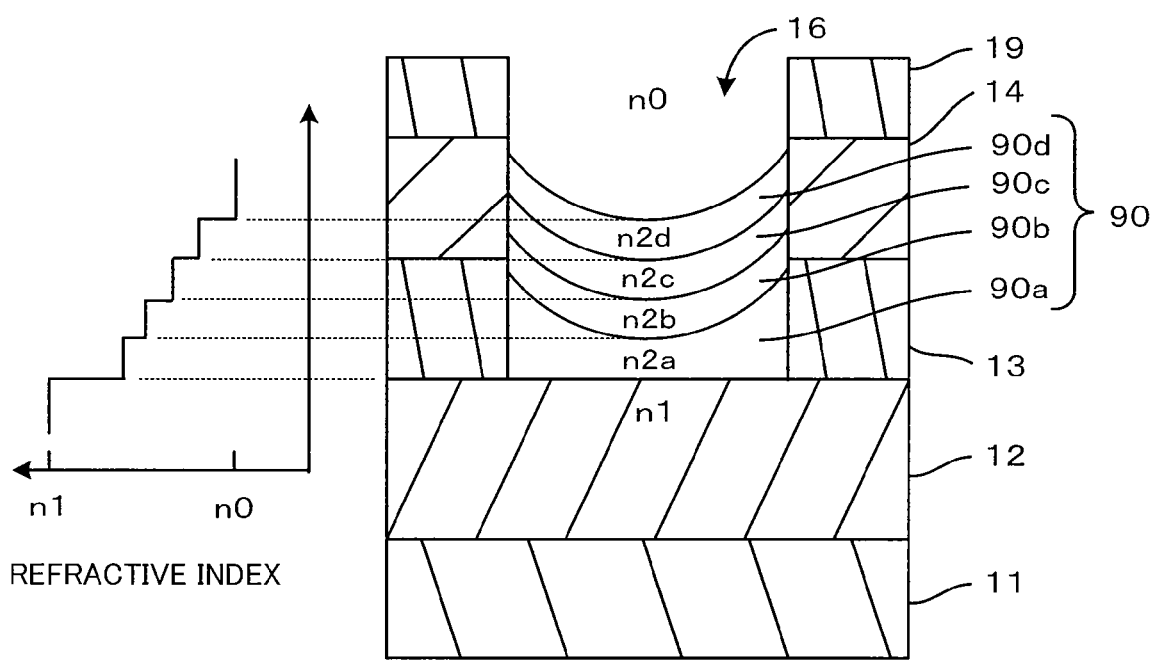
FIG. 13 is a cross-sectional view illustrating the main portion of the semiconductor light emitting device according to a second embodiment.

A semiconductor light emitting device of a second s embodiment will be explained with reference to FIG. 13. FIG. 13 is a cross sectional view illustrating a main portion of the semiconductor light emitting device of the second embodiment. In the second embodiment, the same constituent portions as those of the first embodiment explained above will be denoted with the same reference numerals, and description about the same constituent portions as those of the first embodiment explained above will be omitted. Only portions different from those of the first embodiment explained above will be hereinafter explained. The second embodiment is different from the first embodiment in that the insulating film has a refraction index distribution.

Specifically, as shown in FIG. 13, the insulating film 90 of the second embodiment is a laminated body including multiple insulating films 90a, 90b, 90c, and 90d of which refraction indexes are different. The insulating films 90a, 90b, 90c, and 90d have refraction indexes n2a, n2b, n2c, and n2d, respectively.

The refraction indexes n2a, n2b, n2c, and n2d decrease stepwise from the first semiconductor layer 12 to the second semiconductor layer 14. The refraction indexes n2a, n2b, n2c, and n2d, the refraction index n1 of GaN, and the refraction index n0 of the atmosphere satisfy the following relationship.

$$n1 > n2a > n2b > n2c > d > n0$$

When the refraction index of the insulating film 90 decreases stepwise, the condition of the total reflection of the light extracted from the semiconductor light emitting layer 13 is alleviated, so that much light can be extracted to the outside.

The method of forming the insulating film 90 will be explained. The refraction index of the insulating film changes in accordance with the temperature at which the coating liquid is cured. The higher the temperature of the curing process is, the higher the refraction index of the insulating film becomes.

Accordingly, by laminating the insulating film cured at a lower temperature in a stepwise manner, the insulating film 90 of which refraction index decreases stepwise can be formed.

More specifically, as shown in FIGS. 7A and 7B, after the coating liquid 42 is applied to the trenches 16, an insulating film 90a is formed by performing curing process at a first temperature. After the coating liquid 42 is applied to the insulating film 90a, an insulating film 90b is formed by performing curing process at a second temperature lower than the first temperature.

Likewise, after the coating liquid 42 is applied to the insulating film 90b, an insulating film 90c is formed by performing curing process at a third temperature lower than the second temperature. After the coating liquid 42 is applied to the insulating film 90c, an insulating film 90d is formed by performing curing process at a fourth temperature lower than the third temperature.

As described above, in the second embodiment, the insulating film 90 is provided in the trenches 16 such that the refraction index decreases stepwise from the first semiconductor layer 12 to the second semiconductor layer 14.

There is an advantage in that the condition of the total reflection of the light extracted from the semiconductor light emitting layer 13 is alleviated, so that much light can be extracted to the outside.

The description has been given for the case where the same type of coating material is used to repeat the application and curing process while reducing the curing temperature, whereby the insulating film 90 of which refraction index decreases stepwise is formed. However, the insulating film 90 may be formed by laminating different types of insulating films having different refraction indexes.

Examples of different types of insulating films include SiN (refraction index of approximately 2.0), fluorinated polyimide (refraction index of approximately 1.6), phosphorous doped silicate SOG (refraction index of approximately 1.48), and methylsiloxane SOG (refraction index of approximately 1.38). The method for forming the insulating film is not limited to coating method, and in addition, sputtering method, CVD method, and the like may also be used together.

The number of steps of refraction indexes is preferably larger because each change of the refraction index becomes smaller. In this case, however, many steps and a long time are required to form the insulating film, and therefore, the number of steps may be set at an appropriate number.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
  a semiconductor laminated body comprising layers that are laminated, in order, a first semiconductor layer of a first conductivity-type, a semiconductor light emitting layer, and a second semiconductor layer of a second conductivity-type, and including a plurality of trenches arranged in a periodical manner that penetrate through the second semiconductor layer and the semiconductor light emitting layer and reach the first semiconductor layer, each trench having a width that is greater than a distance between said each trench and a trench that is adjacent thereto, the distance being greater than one-half of a wavelength of light emitted from the semiconductor light emitting layer;

an insulating film in the trenches and being at least partially transparent to the wavelength of light emitted from the semiconductor light emitting layer;

a first electrode electrically connected to the first semiconductor layer; and a second electrode covering the upper surface of the second semiconductor layer.

2. The semiconductor light emitting device according to claim 1, wherein a refraction index of the insulating film is lower than an effective refraction index of the semiconductor laminated body.

3. The semiconductor light emitting device according to claim 1, wherein the insulating film comprises a plurality of insulating films that are laminated together and have different refraction indexes.

4. The semiconductor light emitting device according to claim 1, wherein an upper surface of the insulating film has a convex shape or a concave shape.

5. The semiconductor light emitting device according to claim 1, wherein the second electrode is a transparent conductive film that is at least partially transparent to light emitted from the semiconductor light emitting layer.

6. The semiconductor light emitting device according to claim 1, wherein at least one trench in the plurality of trenches has a cylindrical column shape or a polygonal column shape.

7. The semiconductor light emitting device according to claim 1, wherein the plurality of trenches is in a lattice form.

8. The semiconductor light emitting device according to claim 1, wherein the first semiconductor layer includes an N-type GaN clad layer, and the second semiconductor layer includes a P-type GaN clad layer and a P-type GaN contact layer.

9. The semiconductor light emitting device according to claim 1, wherein the semiconductor light emitting layer is a multiple quantum well structure comprising $In_{x1}Ga_{y1}Al_{(1-x1-y1)}N$ well layers ($0<x1<1$, $0<y1\leq1$) that are laminated in alternation with $In_{x2}Ga_{y2}Al_{(1-x2-y2)}N$ barrier layers ($0\leq x2<x1<1$, $0<y1\leq y2\leq1$).

10. A semiconductor light emitting device, comprising:
a first semiconductor layer of a first conductivity-type;
a plurality of pillars in a periodical arrangement on the first semiconductor layer, the pillars comprising a semiconductor light emitting layer and a second semiconductor layer of a second conductivity-type that are laminated together, each pillar having a diameter that is greater than a distance between said each pillar and a pillar that is adjacent thereto, the distance being greater than one-half of a wavelength of light emitted from the semiconductor light emitting layer;
an insulating film provided on the first semiconductor layer and between the plurality of pillars, the insulating film being at least partially transparent to the wavelength of light emitted from the semiconductor light emitting layer;
a first electrode electrically connected to the first semiconductor layer; and
a second electrode covering an upper surface of the second semiconductor layer.

11. The semiconductor light emitting device according to claim 10, wherein a refraction index of the insulating film is lower than an effective refraction index of the semiconductor light emitting layer and the second semiconductor layer laminated together.

12. The semiconductor light emitting device according to claim 10, wherein the insulating film comprises a plurality of insulating films that are laminated together and have different refraction indexes.

13. The semiconductor light emitting device according to claim 10, wherein an upper surface of the insulating film has a convex shape or a concave shape.

14. The semiconductor light emitting device according to claim 10, wherein the second electrode is a transparent conductive film that is at least partially transparent to the wavelength of light emitted from the semiconductor light emitting layer.

15. The semiconductor light emitting device according to claim 10, wherein the pillars have a cylindrical column shape or a polygonal column shape.

16. The semiconductor light emitting device according to claim 10, wherein the pillars are arranged in a lattice form.

17. The semiconductor light emitting device according to claim 10, wherein the first semiconductor layer includes an N-type GaN clad layer, and the second semiconductor layer includes a P-type GaN clad layer and a P-type GaN contact layer.

18. The semiconductor light emitting device according to claim 10, wherein the semiconductor light emitting layer is a multiple quantum well structure comprising $In_{x1}Ga_{y1}Al_{(1-x1-y1)}N$ well layers ($0<x1<1$, $0<y1\leq1$) that are laminated in alternation with $In_{x2}Ga_{y2}Al_{(1-x2-y2)}N$ barrier layers ($0\leq x2<x1<1$, $0<y1\leq y2\leq1$).

19. The semiconductor light emitting device according to claim 1, wherein the second electrode is a metal film substantially covering all of the upper surface of the second semiconductor layer, the metal film substantially opaque to the wavelength of light emitted from the semiconductor light emitting layer.

20. The semiconductor light emitting device according to claim 10, wherein the second electrode is a metal film substantially covering all of the upper surface of the second semiconductor layer, the metal film substantially opaque to the wavelength of light emitted from the semiconductor light emitting layer.

* * * * *